United States Patent [19]

Danilatos

[11] Patent Number: 4,897,545
[45] Date of Patent: Jan. 30, 1990

[54] ELECTRON DETECTOR FOR USE IN A GASEOUS ENVIRONMENT

[75] Inventor: Gerasimos D. Danilatos, North Bondi, Australia

[73] Assignee: ElectroScan Corporation, Danvers, Mass.

[21] Appl. No.: 257,754

[22] Filed: Oct. 14, 1988

Related U.S. Application Data

[63] Continuation-in-part of Ser. No. 52,700, May 21, 1987, Pat. No. 4,785,182, and a continuation-in-part of Ser. No. 158,208, Feb. 19, 1988, Pat. No. 4,823,006.

[30] Foreign Application Priority Data

Oct. 16, 1987 [AU] Australia .................... PI4918

[51] Int. Cl.$^4$ .......................................... H01J 37/244
[52] U.S. Cl. ...................................... 250/310; 250/397
[58] Field of Search .............................. 250/310, 397

[56] References Cited

U.S. PATENT DOCUMENTS

| Re. 27,005 | 12/1970 | Wingfield et al. | 250/310 |
| 3,612,859 | 10/1971 | Schumacher | 250/307 |
| 4,596,928 | 6/1986 | Danilatos | 250/310 |
| 4,596,929 | 6/1986 | Coates et al. | 250/397 |
| 4,720,633 | 1/1988 | Nelson | 250/310 |
| 4,794,259 | 12/1988 | Sanderson et al. | 250/310 |

FOREIGN PATENT DOCUMENTS 2186737  8/1987  United Kingdom .

OTHER PUBLICATIONS

Danilatos et al., *Scanning*, vol. 2, 1979, pp. 72–82.
Danilatos, "A Gaseous Detector Device for an Environmental SEM", *Micron and Microscopa Acta* 14(4), pp. 307–318 (1983).
Danilatos, "Design and Construction of an Atmospheric or Environmental SEM", (Part 3), *Scanning*, vol. 7, 26–42 (1985).
Danilatos, G. D., "Improvements on the Gaseous Detector Device", G. D. Bailey, Ed., Proceedings of the 44th Annual Meeting of the Electron Microscopy of America, pp. 630–631 (1986).
Danilatos, G. D., "ESEM—A Multipurpose Surface Electron Microscope," G. W. Bailey, Ed., Proceedings of the 44th Annual Meeting of the Electron Microscopy Society of America, pp. 632–633 (1986).
Danilatos, G. D. et al., "Principles of Scanning Electron Microscopy at High Specimen Chamber Pressures," *Scanning*, vol. No. 2, 1979, pp. 72–82.

*Primary Examiner*—Jack I. Berman
*Attorney, Agent, or Firm*—Curtis, Morris & Safford

[57] ABSTRACT

An improved gaseous detector device for an environmental scanning electron microscope (ESEM) is provided. The detector device includes a generally annular electrode assembly having an inner electron detector formed of a thin ring, an intermediate electron detector positioned radially outwardly of the inner electron detector which is formed of a first plurality of concentric arc segments, and an outer electron detector positioned radially outwardly of the intermediate electron detector which is formed of a second plurality of concentric arc segments. The first plurality of concentric arc segments is positioned generally normal to the second plurality of concentric arc segments to obtain a directional topographic contrast. The inner, intermediate and outer electron detectors are aligned along generally the same horizontal plane.

50 Claims, 3 Drawing Sheets

ELECTRON DETECTOR FOR USE IN A GASEOUS ENVIRONMENT

BACKGROUND OF THE INVENTION

This application is a continuation-in-part of U.S. patent application Ser. No. 052,700 entitled Secondary Electron Detector for Use in a Gaseous Atmosphere, filed May 21, 1987, now Pat. No. 4,785,182 and also U.S. patent application No. 158,208, entitled Integrated Electron Optical/ Differential Pumping/ Imaging Signal Detection System for an Environmental Scanning Electron Microscope, filed Feb. 19, 1988 now U.S. Pat. No. 4,823,006.

This invention relates to the field of environmental scanning electron microscopes (ESEM), and more particularly to an environmental scanning electron microscope having a practical multi-electrode configuration of a gaseous detector device for the definition of detection volume and signal separation in the ESEM.

As background, the advantages of the ESEM over the standard scanning electron microscope (SEM) lie in its ability to produce high-resolution electron images of moist or nonconductive specimens (e.g., biological materials, plastics, ceramics, fibers) which are extremely difficult to image in the usual vacuum environment of the SEM. The ESEM allows the specimen to be maintained in its "natural" state, without subjecting it to the distortions caused by drying, freezing, or vacuum coating normally required for high-vacuum electron beam observation. Also, the relatively high gas pressure easily tolerated in the ESEM specimen chamber acts effectively to dissipate the surface charge that would normally build up on a nonconductive specimen, blocking high quality image acquisition. The ESEM also permits direct, real-time observation of liquid transport, chemical reaction, solution, hydration, crystallization, and other processes occurring at relatively high vapor pressures, far above those that can be permitted in the normal SEM specimen chamber.

This technological advance in imaging capability opens up a previously hidden world of microscopic phenomena to investigators in a wide spectrum of disciplines, including, but not limited to, medicine, biology, food and drug technology, geology, composite materials, textiles, semiconductors and forensics, in short, any field involving specimens which are difficult to image with the standard SEM.

A previous problem, however, encountered in utilizing previous ESEM designs was the inability of the gaseous detector device to separate the various signals emitted by the electron beam impinging upon the specimen, such as low energy secondary electrons, higher energy backscattered electrons, low-angle reflected electrons and high-angle reflected electrons. As a result thereof, this invention provides a practical multi-electrode configuration for a gaseous detector device which allows for the definition of detector volumes and signals separation in the ESEM. As such, this ESEM provides for better imaging capabilities.

Furthermore, in previous ESEM's, an electron detector was placed integral with the pressure limiting aperture. The positively biased detector electrode/pressure limiting aperture and the specimen holder (at ground) form a parallel-plate capacitor wherein the electrical potential drops uniformly with the distance across this gap, that is, free electrons experience a uniform acceleration toward the positive electrode regardless of their position in the gap. It has been found however that if an electrically isolated screen or grid is positioned between the specimen and the detector electrode, significant improvements in the collection of signals in the ESEM results. By applying appropriately scaled voltages to the grid (and/or the specimen holder) it is possible to divide the collection region or "detection volume" into two zones of independent field strengths one above and one below the grid. The grid thus become a control element in the electron detector system.

OBJECTS OF THE INVENTION

It is a general object of this invention to provide an improved electron detector for use in a gaseous environment.

It is also an object of this invention to provide an improved electron detector for use in an environmental scanning electron microscope which permits direct, real-time observation of liquid transfer, chemical reactions, solutions, hydration, crystallization, and other processes occurring at relatively high vapor pressures.

It is a further object of the invention to provide a improved electron detector for use in an scanning electron microscope which provides for separation of the various signals emanating from the surface of the specimen, such as low energy secondary electrons, higher energy backscattered electrons, and low-angle and high-angle reflected electrons.

It is yet another object of this invention to provide an electron detector for use in an environmental scanning electron microscope which provides for the definition of detection volumes in the ESEM.

It is a still further object of this invention to provide an electron detector for use in environmental scanning electron microscope which is of generally annular configuration and has a plurality concentric arc segments which are initially biased at the same electrical potential to collect the various signals emanating from the surface of the specimen.

It is another object of this invention to provide an electron detector for use with an environmental scanning electron microscope wherein a three dimensional array of electrodes is located generally at or just below the plane of the pressure limiting aperture, or at planes below and above this aperture.

It is still a further object of this invention to provide an electron detector for use with an environmental scanning electron microscope wherein a plurality of electrodes are biased with positive and/or negative voltages for the purposes of signal separation, filtration and amplification.

It is another further object of this invention to provide an environmental scanning electron microscope having a biased grid positioned between the specimen holder and electron detector such that the electron flux emitted from the beam-specimen interaction may be easily separated according to energy.

It is yet a further object of this invention to provide an environmental scanning electron microscope having a biased grid in the specimen chamber which more easily sets and controls the amplification in the gaseous environmental of the signals emanating from the sample caused by the gaseous environment of the specimen chamber.

It is still a further object of this invention to provide an environmental scanning electron microscope having a biased grid in the specimen chamber such that the signal-to-noise ratio may be improved for high resolution imaging signals.

Other objects and advantages of the invention will become apparent from the detailed description and from the appended drawings in which like numbers have been used to designate like parts in the several views.

SUMMARY OF THE INVENTION

This invention relates generally to an improved environmental scanning electron microscope, and more particularly, to an improved electron detector for use with an environmental scanning electron microscope which provides for the separation of the various signals emanating from the surface of the specimen, such as low energy secondary electrons, higher energy backscattered electrons, and low-angle and high-angle reflected electrons.

In a preferred embodiment, the electron microscope includes an electron gun for generating and directing an electron beam towards a specimen to be examined. The vacuum system of the electron microscope includes a substantially cylindrical objective lens magnetic housing containing an axially disposed vacuum liner tube which has a pressure limiting aperture at the lower end thereof. The objective lens housing also includes a means for focusing the beam of electrons capable of directing the beam of electrons emitted by the electron gun across the diameter of the pressure limiting aperture.

A specimen chamber is positioned below the objective lens assembly and is capable of maintaining the specimen enveloped in gas in registration with the pressure limiting aperture such that a surface of the specimen may be exposed to the focused beam of electrons. A specimen mount is located within the specimen chamber and is positioned for supporting the specimen approximately 1 to 10 mm below the pressure limiting aperture so as to allow for the focused beam of electrons to interact with the specimen.

In accordance with one of the general objects of the invention, the environmental scanning electron microscope of the present invention includes a suitable geometrical electron detector configuration which serves to separate various signals emanating from the surface of the specimen, i.e., low energy secondary electrons, higher energy backscattered electrons, low-angle reflected electrons, and high-angle reflected electrons. These various signals carry information about the specimen which are important to one skilled in the science of microscopy as to energy and angular relationships.

More specifically, this configuration includes an electron detector formed integrally with the pressure limiting aperture. Normally, this pressure limiting aperture detector is biased at some electrical potential, but the electrical potential may be variably biased to produce increased imaging capabilities. In addition, a three dimensional generally annular electrode assembly is provided at or just below the pressure limiting aperture within the specimen chamber and above the surface of the specimen. This electrode assembly, however, may also be positioned at planes above or below the pressure limiting aperture. This annular electrode assembly includes an inner electron detector formed of a thin ring of wire which has a wire thickness of approximately 50 to 100 microns and is preferably made of metal. The diameter of this ring is slightly larger than the diameter of the pressure limiting aperture. The inner electron detector collects predominantly an amplified secondary electron signal. The generally annular electrode assembly also includes an intermediate electron detector positioned radially outwardly of the inner electron detector which is formed of a first plurality of concentric arc segments. The intermediate electron detector has an inner diameter of approximately 0.8 mm and has an outer diameter of approximately 3 mm. The intermediate electron detector collects predominantly an amplified mix of secondary and backscattered electron signals. The relative strength of signals in the mix depends on the parameters of pressure, specimen distance and electrode bias used. The annular electrode assembly further includes an outer electron detector positioned radially outwardly of the intermediate electron detector which is formed of a second plurality of concentric arc segments. The outer electron detector collects predominantly low angle reflected signals. In order to obtain a directional topography contrast, the intermediate and outer electron detectors are split in concentric arc segments and are positioned approximately opposite or normal to one another. In addition, the inner, intermediate and outer electron detectors of the annular electrode assembly are contained within the same horizontal plane.

Finally, another electron detector is positioned above the pressure limiting aperture within the aperture carrier. This electron detector collects predominantly high-angle reflected signals and is a thin ring preferably made of metal.

Initially, the inner, intermediate and outer electron detectors are biased at the same electrical potential. All signals from the various electrodes can be manipulated first by adjusting the electrode bias and then by electronic means (mixing and processing). The electrodes are biased with positive and/or negative voltages for the purposes of signal separation, filtration and amplification. The signals from the specimen ionize the gas, in both regions, below and above the pressure limiting aperture, by their own energy and/or by the energy imparted to electrons/ions by the electric field of the electrodes.

The electrical outputs of the electrodes carry information from the specimen and this information is analyzed and displayed by known methods of electron microscopy. In order to achieve this result, the environmental scanning electron microscope of this invention includes a separate current amplifier connected to each electron detector of the circular electrode assembly which receives the current collected at each detector of the annular electrode assembly. Alternatively, each amplifier connected to an electron detector of the annular electrode assembly may be independently connected to a variable biasing means which separately biases each of these electron detectors.

With this geometrical configuration of a gaseous detector device for an ESEM having a detector formed integrally with the pressure limiting aperture, the generally annular electrode assembly, and the aperture carrier electrode detector, a practical multi-electrode configuration for the definition of detection volume and signal separation in the microscope is provided.

Alternatively or additionally, an electrically isolated screen or grid may be positioned between the specimen and the electrode detector. This grid is biased at an electrical potential which is greater than the electrical potential of the specimen mount but less than the electrical potential applied to the electron detector. In order to increase the acceleration, and hence amplification, of the secondary electrons, the grid is preferably placed closer to the specimen mount than to the electron detectors.

The screen offers significant improvements in the collection and amplification of the signals of interest in the ESEM. By applying appropriately scaled voltages to the grid (and/or the specimen stage), it is possible to divide the collection region or "detection volume" into two zones of independent field strengths, one above and one below the grid. The grid thus becomes a control element in the system which provides for easier separation of the various components of the electron flux from the beam-specimen interaction, the gaseous amplification factors may be more easily set and controlled, and signal-to-noise ratio may be improved for high resolution (secondary electron) imaging signals. Thus, enhancement of cascade-amplification of the secondary electrons results. As such, this grid produces a significant increase in the clarity of the signals received by one detector which is enhanced by the separation of those signals.

BRIEF DESCRIPTION OF THE DRAWINGS

The following detailed description, given by way of example, but not intended to limit the invention solely to the specific embodiments described, may best be understood in conjunction with the accompanying drawings in which.

DETAILED DESCRIPTION OF THE PREFERRED EMBODIMENT

Figures 1, 2:
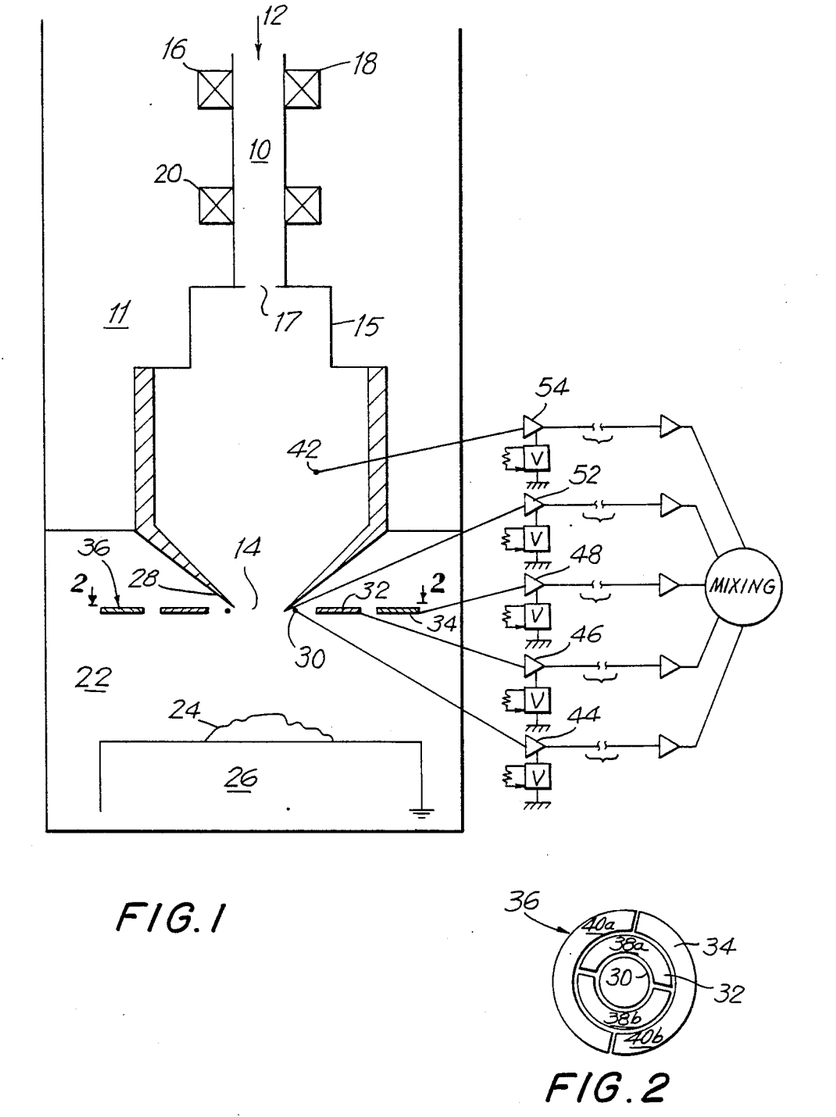
FIG. 1 is a schematic cross-sectional view (not to scale) of one preferred embodiment of the environmental scanning electron microscope of this invention.
FIG. 2 is a top elevational view taken along line 2—2 of FIG. 1.

Referring now to FIG. 1, an environmental scanning electron microscope ("ESEM") is illustrated which provides a device for generating, amplifying and detecting secondary and backscatter electrons emanating from a surface of a sample being examined. A beam of electrons is emitted through an electron optical column 10 of the objective lens assembly 11 by an electron gun 12. The vacuum optical column 10 includes a final pressure limiting aperture 14 at its lower end thereof. This pressure limiting aperture 14 is formed within the lower end of an aperture carrier 15. This aperture carrier 15 is discussed to in U.S. patent application Ser. No. 158,208 filed Feb. 19, 1988, the subject matter of which is incorporated by reference. This aperture carrier includes a second pressure limiting aperture 17 above final pressure limiting aperture 14 which communicates directly with the electron optical column 10. Preferably, the final pressure limiting aperture 14 has a diameter of approximately 500 microns. The electron beam passes through magnetic lenses 16 and 18 which are used to focus the beam. Focusing means 20 is located within the objective lens assembly 11 adjacent to the vacuum column and is capable of directing the beam of electrons through the final pressure limiting aperture 14.

The beam is subsequently directed into a specimen chamber 22 through final pressure limiting aperture 14 wherein it impinges upon a specimen 24 supported upon a specimen stage 26. The specimen mount or stage 26 is located within specimen chamber 22 and is positioned for supporting specimen 24 approximately 1 to 10 mm below final pressure limiting aperture 14 so as to allow the beam of electrons to interact with the specimen. The specimen chamber is disposed below the optical vacuum column 10 and is capable of maintaining the sample 24 enveloped in gas, preferably nitrogen or water vapor, at a pressure of approximately between 1 to 25 Torr in registration with the pressure limiting aperture such that a surface of the specimen may be exposed to a charged particle beam emitted from the electron gun and directed through the pressure limiting aperture 14.

As a result of the specific geometrical configuration of the gaseous detector device of this ESEM, the various signals emanating from the specimen may be separated to provide for better imaging capabilities. In one preferred embodiment of the present invention, the ESEM includes five electrodes. First, low energy secondary electrons emanating from the specimen surface impinge upon an electron detector 28 formed integrally with final pressure limiting aperture 14. The pressure limiting aperture detector 28 is biased at some predetermined electrical potential which prevent the secondary electrons emitted from the specimen from escaping through its opening. As such, the integral pressure limiting aperture detector collects an amplified low energy secondary electron signal.

Three electrodes, namely 30, 32 and 34, are integrally contained within a generally annular electrode assembly 36 (see FIGS. 1 and 2). The inner electron detector 30 of generally annular electrode assembly 36 is formed of a thin ring and is preferably made of metal. In the preferred embodiment, the inner electron detector is a thin wire having a wire thickness of approximately 50 to 100 microns. The diameter of the inner electron detector 30 is just slightly larger than the diameter of the pressure limiting aperture 14 and is placed immediately below and separated therefrom. The electrode assembly 36 can be positioned, however, above or below the pressure limiting aperture 14. The inner electron detector collects amplified low energy secondary electrons emanating from the surface of the sample.

Intermediate electron detector 32 of annular electrode assembly 36 is positioned radially outwardly of the inner electron detector 30 and is formed of a first plurality of concentric split generally flat arc segments, such as 38a and 38b (see FIG. 2). As is shown in FIG. 1, the intermediate annular electron detector 32 preferably has an inner diameter of approximately 0.8 mm and an outer diameter of about 3 mm. With this design, the intermediate electron detector collects predominantly an amplified mix of higher energy secondary and backscattered electron signals emanating from the surface of the sample. The relative strength of signals in the mix depends on the parameters of pressure, specimen distance and electrode bias used.

The outer electron detector 34 of annular electrode assembly 36 is positioned radially outwardly of intermediate electron detector 32 and is formed of a second plurality of concentric split generally flat arc segments, such as 40a and 40b. The outer annular electron detector 34 collects amplified low angle backscattered reflected signals which show the topography of the sample. The angle of the reflected signal is defined as the incidence angle of the imaging signal from the horizontal plane of the specimen.

In order to provide a broader spectrum of imaging capabilities, such as topography, the concentric arc segments 38a and 38b of intermediate annular electron detector 32 and the concentric arc segments 40a and 40b of outer electron sector 34 are split into equal segments, preferably in a generally normal orientation with one another. By electronically subtracting the output of one half of the arc segments from the output of the other half, topographic shading by Z-contrast suppression can be effected in a manner usually associated with typical backscattered electron detectors.

In order to collect high-angle backscattered electrons emanating from the surface of specimen 24, another detector 42 is positioned above final pressure limiting aperture 14 but below higher pressure limiting aperture 17 within the aperture carrier 15. The aperture carrier detector 42 is formed of a thin ring and preferably made of metal. This annular electrode 42 is placed above pressure limiting aperture 14 to detect ionization caused by the backscattered electrons escaping through the pressure limiting aperture 14 as well as to collect amplified high-angle backscattered reflected signals which show atomic number contrast.

In summary, the detectors herein separate the various signals as follows. The pressure limiting aperture detector 28 and inner electron detector 30 will collect predominantly amplified lower energy secondary electrons related signals. The intermediate electron detector 32 of the annular electrode assembly will collect predominantly amplified higher energy backscattered electron signals. The outer electron detector 34 will collect predominantly amplified low angle backscattered reflected signals showing topography contrast while the aperture carrier electron detector 42 positioned above the pressure limiting aperture 14 will collect predominantly amplified high angle backscattered reflected signals showing atomic number contrast. A very small fraction of the backscattered electrons may be mixed with the secondary electrons, and if visible, this small fraction can be subtracted electronically with the aid of the signals from the other electrodes being manipulated first by adjusting the electrode bias and then by electronic means (mixing and processing).

Even though the inner, intermediate and outer electron detectors 30, 32 and 34, respectively, of annular electrode assembly 36 lie generally in the same horizontal plane, these three electrodes are separated and initially biased at the same electrical potential, preferably 400 volts. However, each of the five electrodes may be biased variably with positive and/or negative voltages for the purposes of signal separation, filtration and amplification. The signals emanating from the sample ionize the gas in both regions above and below the pressure limiting aperture 14 by their own energy and/or by the energy imparted to electron ions by the electric field of the electrodes.

The electrical outputs of the five electrodes carry information from the specimen and this information is analyzed and displayed by known methods of electron microscopy. Specifically, the three electron detectors 30, 32 and 34 are interconnected independently either to a separate current amplifier such as 44, 46 and 48 (see FIG. 1) or each is interconnected to a separate amplifier connected to a common variable voltage source which is capable of amplifying information received from the three electron detectors (See FIG. 3). The pressure limiting aperture detector 28 and aperture carrier detector 42 are independently connected to separate current amplifiers 52 and 54, respectively, which amplifier information received from these two detectors. The amplifiers 44, 46 and 48 float at the detector bias voltage and are coupled at full bandwidth to grounded video circuits such as 62, 64, 66, respectively. The video circuits are connected to a display device.

As a result of the geometrical configuration of the gaseous detector device of this ESEM, low energy secondary electrons, higher energy backscattered electrons, low-angle reflected electrons and high-angle reflected electrons may be collected. As such, this ESEM provides for increased imaging capabilities, especially in terms of the topography and atomic number contrasts.

In the previously above-described electron detector system, the positively biased detector electrode formed integrally with the pressure limiting aperture and the specimen holder (at ground) form a parallel-plate capacitor wherein the electric potential drops uniformly with distance across the gap between the "plates". Since the field strength is constant across this gap, the electrons experience a uniform acceleration toward the positive electrode (i.e., the pressure limiting aperture electrode) regardless of the position in the gap.

If, an electrically isolated screen or grid 70 (see FIG. 4) is placed between the specimen and the detector electrodes, significant improvements in the collection and amplification of the signals of interest in the ESEM are attained. This grid 70 is preferably formed of wire mesh. By applying appropriately scaled voltages to the grid and/or the specimen holder), it is possible to divide the collection region or "detection volume" into two zones of independent field strength, one above and one below the grid.

Figure 4:
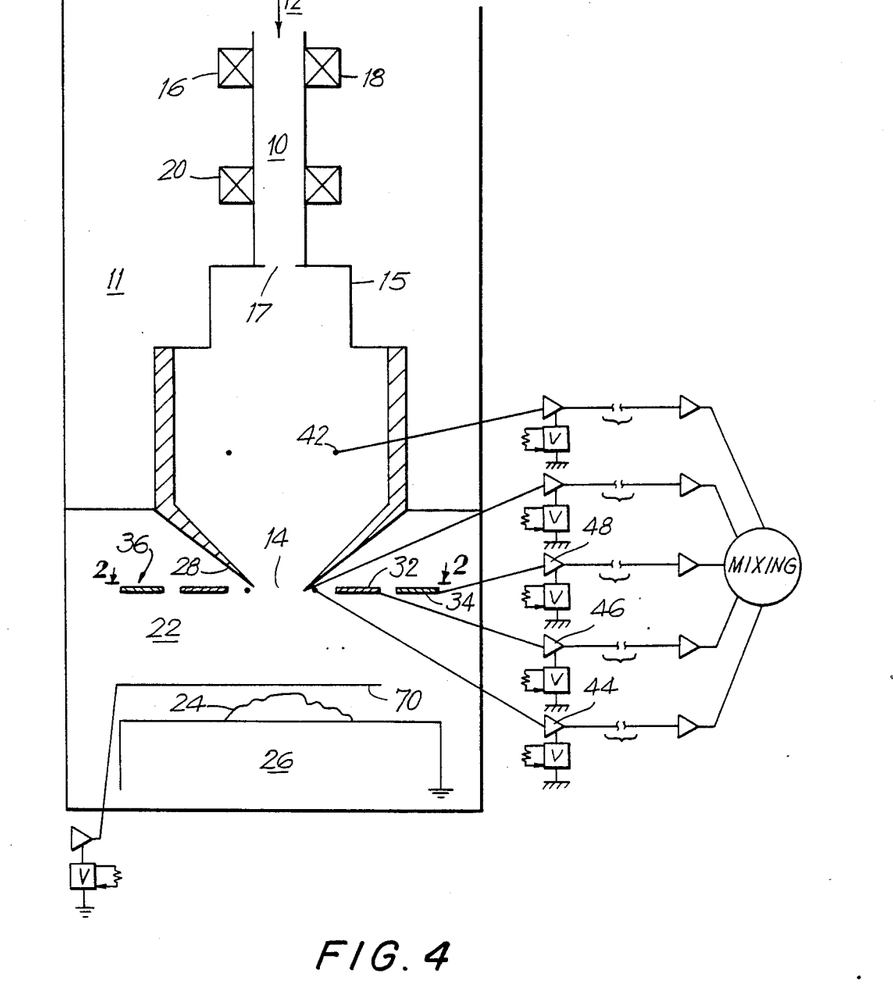
FIG. 4 is a schematic cross-sectional view (not to scale) of yet another preferred embodiment of the environmental scanning electron microscope of this invention.

As an example, if the distance between the specimen mount and the pressure limiting aperture electrode detector 28 is 10 mm and control grid 70 is positioned 1 mm from the specimen mount 26, and the pressure limiting aperture electrode is biased at 300+V, control grid 70 is biased at 90+V and the specimen mount is biased at ground, the low energy electrons emanating from the specimen will be preferentially amplified.

As such, the grid thus becomes a control element in the system. With this control grid, the various components of the electron flux from the beam-specimen interaction may be more easily separated. Using a negative voltage on the grid will tend to suppress the low energy secondary electrons from the specimen, while a positive voltage will enhance their collection.

Additionally, the gaseous amplification factors may be more easily set and controlled. Since the gas multiplication effect is critically dependent on gas pressure and field strength, the single-electrode system imposes strict limitations on working distance at a given pressure. Also, the high field strengths required to amplify weaker signals can lead to undesirable breakdowns of the gas around the pressure limiting aperture, where clearances to grounded metal are minimal. Use of the biased grid allows more freedom of operation in both of these areas.

Furthermore, the signal-to-noise ratio may be improved for high resolution (secondary electron) imaging signals. This major advantage over the single-electrode system is due to the fact that secondary electrons originating from the specimen surface may be given preferential amplification by a strong field below the grid, while backscatter-produced free electrons and other extraneous signal quanta produced above the grid receive less amplification by the relatively weaker field in the zone above the grid. This results in an imaging signal with more surface detail and better contrast.

Figure 3:
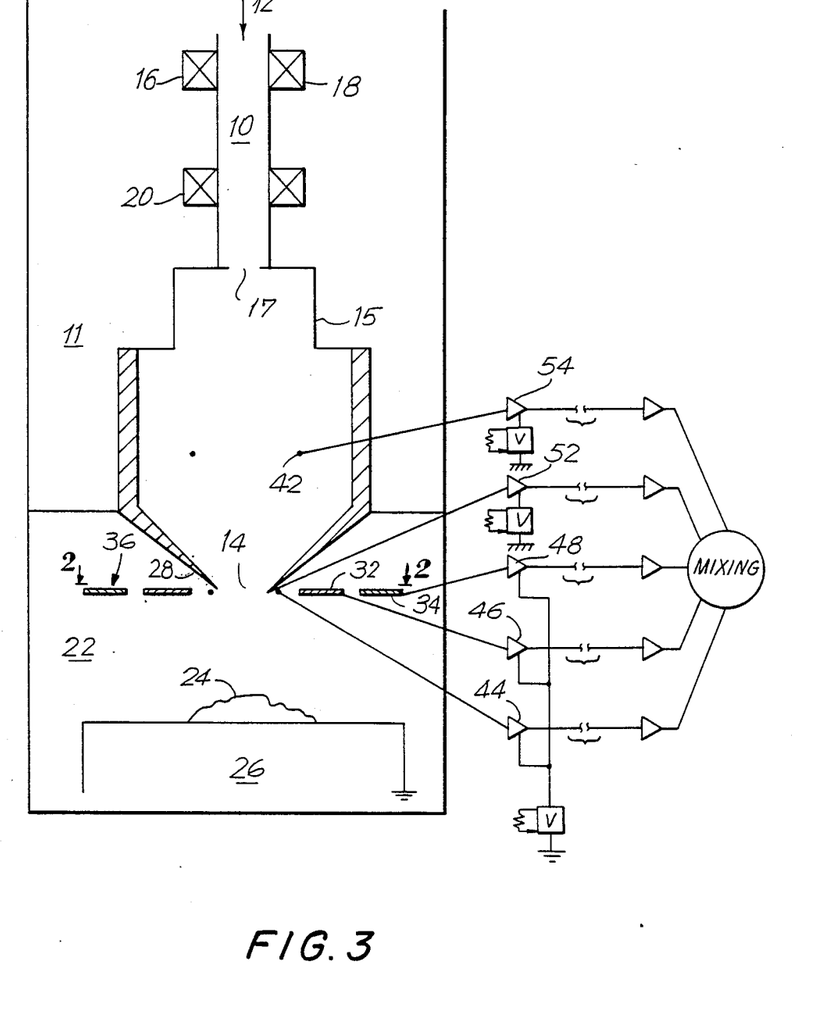
FIG. 3 is the schematic cross-sectional view (not to scale) of another preferred embodiment of the environmental scanning electron microscope of this invention.

The above described control grid may be utilized with the electrode detector configuration of FIGS. 1 and 3 herein or may be utilized in any situation wherein an electrode is positioned above the control grid with the control grid being biased at an electrical potential greater then the electrical potential applied to the specimen mount but less than applied to the electrode detector. With this arrangement, increased signal acceleration will result providing for increased amplification of the secondary electrons.

While the invention has been particularly shown and described with reference to certain preferred embodiments, it will be readily appreciated by those of ordinary skill in the art that various changes and modifications ay be made without departing from the spirit and scope of the invention. It is intended that the appended claims be interpreted as including the foregoing as well as various other such changes and modifications.

What is claimed is:

1. An improved environmental scanning electron microscope comprising:
   (a) means for generating and directing an electron beam towards a specimen;
   (b) means for detecting signals emanating from the surface of the specimen; said detecting means including a generally annular electrode assembly having an inner electron detector formed of a thin ring, an intermediate electron detector positioned radially outwardly of said inner electron detector and being formed of a first plurality of concentric arc segments, and an outer electron detector positioned radially outwardly of said intermediate electron detector and being formed of a second plurality of concentric arc segments, said first plurality of concentric arc segments being positioned generally normal to said second plurality of concentric arc segments to obtain a directional topography contrast, said inner, intermediate, and outer electron detectors being aligned along generally the same horizontal plane; and
   (c) means for separately biasing said inner, intermediate and outer electron detector initially at the same electrical potential.

2. The improved environmental scanning electron microscope of claim 1 wherein said inner electron detector is a wire having a wire thickness of approximately 50 to 100 microns.

3. The improved environmental scanning electron microscope as set forth in claim 1 wherein said inner electron detector is made from metal.

4. The improved environmental scanning electron microscope as set forth in claim 1 wherein said intermediate electron detector has an inner diameter of approximately 0.8 mm and an outer diameter of approximately 3 mm.

5. The improved environmental scanning electron microscope as set forth in claim 1 wherein said inner, intermediate, and outer electron detectors are initially biased at approximately 400 volts.

6. An improved environmental scanning electron microscope comprising:
   (a) a vacuum column having a pressure limiting aperture at the lower end thereof;
   (b) a charged particle beam source located within the vacuum column which emits a charged particle beam;
   (c) focusing means located within the vacuum column which directs a charged particle beam emitted by said charged particle beam source through said pressure limiting aperture;
   (d) a specimen chamber, positioned below said pressure limiting aperture, which maintains the specimen enveloped in gas at a pressure of approximately 1 to 25 Torr in registration with the pressure limiting aperture such that a surface of the sample may be exposed to a charged particle beam emitted from the charged particle beam source and directed through said pressure limiting aperture;
   (e) a specimen mount located within said specimen chamber and positioned for supporting said specimen approximately 1 mm below said pressure limiting aperture so as to allow the focused beam of electrons to interact with said specimen;
   (f) first means for detecting signals emanating from the surface of the specimen; said first detecting means including a generally annular electrode assembly having an inner electron detector formed of a thin ring, and intermediate electron detector positioned radially outwardly of said inner electron detector and being formed of a first plurality of concentric arc segments, and an outer electron detector positioned radially outwardly of said intermediate electron detector and being formed of a second plurality of concentric arc segments; said first plurality of concentric arc segments being positioned generally normal to said second plurality of concentric arc segments; said inner, intermediate, and outer electron detectors being aligned along generally the same horizontal plane; and
   (g) means for separately biasing said inner, intermediate and outer electron detectors initially at the same electrical potential.

7. The improved environmental scanning electron microscope as set forth in claim 6 wherein said pressure limiting aperture is approximately 500 microns in diameter.

8. The improved environmental scanning electron microscope as set forth in claim 6 wherein said inner electron detector is a wire having a wire thickness of approximately 50 to 100 microns.

9. The improved environmental scanning electron microscope as set forth in claim 6 wherein said inner electron detector made of metal.

10. The improved environmental scanning electron microscope as set forth in claim 6 wherein said specimen chamber is enveloped in nitrogen.

11. The improved environmental scanning electron microscope as set forth in claim 6 wherein said intermediate electron detector has an inner diameter of approximately 0.8 mm and an outer diameter of approximately 3 mm.

12. The improved environmental scanning electron microscope as set forth in claim 6 wherein said pressure limiting aperture includes second means for detecting signals emanating from said specimen being formed integrally therewith.

13. The improved environmental scanning electron microscope as set forth in claim 12 wherein said second detecting means is initially biased at a predetermined electrical potential.

14. The improved environmental scanning electron microscope of claim 12 wherein said second detecting means is biased at varying electrical potentials.

15. The improved environmental scanning electron microscope as set forth in claim 6 and further including third means for detecting signals emanating from said specimen being positioned above said pressure limiting aperture within an aperture carrier.

16. The improved environmental scanning electron microscope as set forth in claim 15 wherein said third detector means is a thin annular ring formed preferably of metal.

17. The improved environmental scanning electron microscope as set forth in claim 15 wherein said third detecting means is biased at varying electrical potentials.

18. The improved environmental scanning electron microscope as set forth in claim 6 wherein said inner electron detector includes means for collecting predominantly amplified lower energy secondary electron signals.

19. The improved environmental scanning electron microscope as set forth in claim 6 wherein said intermediate electron detector includes means for collecting predominantly amplified higher energy backscattered related signals.

20. The improved environmental scanning electron microscope as set forth in claim 6 wherein said outer electron detector includes means for collecting predominantly amplified low angle reflected signals.

21. The improved environmental scanning electron microscope as set forth in claim 12 wherein said second detecting means includes means for collecting predominantly amplified low energy secondary electron signals.

22. The improved environmental scanning electron microscope as set forth in claim 15 wherein said third detector means includes means for collecting predominantly amplified high angle reflected signals.

23. An improved environmental scanning electron microscope comprising:
(a) means for generating and directing an electron beam toward a specimen; and
(b) means for detecting signals emanating from the surface of the specimen, said detection means including a generally annular electrode assembly having an inner electron detector formed of a thin ring and an outer electron detector positioned radially outwardly of said inner electron detector which is formed of a plurality of concentric arc segments which are biased at different electrical potentials.

24. An apparatus for detecting signals emanating from the surface of a specimen being examined within an environmental scanning electron microscope comprising a generally annular electrode assembly having an inner electron detector formed of a thin ring, an intermediate electron detector positioned radially outwardly of said inner electron detector and being formed of a first plurality of concentric arc segments, and an outer electron detector positioned radially outwardly of said intermediate electron detector and being formed of a second plurality of concentric arc segments; said first plurality of concentric arc segments being positioned generally normal to said second plurality of concentric arc segments; said inner, intermediate, and outer electron detectors being aligned along generally the same horizontal plane.

25. The apparatus of claim 24 and further including means for separately biasing said inner, intermediate and outer electron detectors initially at the same electrical potential.

26. An improved environmental scanning electron microscope comprising:
(a) a substantially cylindrical objective lens magnetic housing containing an axially disposed vacuum liner tube having a pressure limiting aperture and containing means for magnetically focusing the beam of electrons passing through said liner tube toward a specimen;
(b) a specimen chamber positioned below said objective lens, said specimen chamber maintaining the specimen enveloped in gas in registration with the pressure limiting aperture such that a surface of the specimen may be exposed to the focused beam of electrons;
(c) means for detecting signals emanating from the surface of the specimen, said detection means including:
(1) a first electron detection formed integrally with said pressure limiting aperture;
(2) a second electron detection positioned below said pressure limiting aperture formed of a thin ring;
(3) third and fourth electron detectors positioned radially outwardly of said second electron detector and each formed as a plurality of concentric arc segments; and
(4) a fifth electron detector positioned above said pressure limiting aperture.

27. The improved environmental scanning electron microscope as set forth in claim 26 and further including means for separately biasing each electron detector initially at the same electrical potential.

28. The improved environmental scanning electron microscope as set forth in claim 27 and further including means for recording information detected by each said detector, said recording means including a separate current amplifier connected to each said detector to receive the current collected at each said detector.

29. The improved environmental scanning electron microscope as set forth in claim 27 and further including means for recording information detected by each said detector, said recording means including a single current amplifier connected to each said biasing means to receive separately the current collected at each said detector.

30. The improved environmental scanning electron microscope as set forth in claim 26 wherein said pressure limiting aperture is approximately 500 microns in diameter and said second detector has a wire thickness which is approximately 50 to 100 microns.

31. The improved environmental scanning electron microscope as set forth in claim 26 wherein said second detector is made of metal.

32. The improved environmental scanning electron microscope as set forth in claim 26 wherein said third detector has an inner diameter of approximately 0.8 mm and an outer diameter of approximately 3 mm.

33. The improved environmental scanning electron microscope as set forth in claim 26 wherein the concentric arc segments of said third and fourth electron detectors are positioned generally opposite to one another to obtain a directional topography contrast.

34. The improved environmental scanning electron microscope as set forth in claim 26 wherein said second electron detector includes means for collecting predominantly amplified secondary electron signals.

35. The improved environmental scanning electron microscope as set forth in claim 26 wherein said third electron detector includes means for collecting predominantly amplified higher energy backscattered related signals.

36. The improved environmental scanning electron microscope as set forth in claim 26 wherein said fourth electron detector includes means for collecting predominantly amplified related low angle reflected signals.

37. The improved environmental scanning electron microscope as set forth in claim 26 wherein said fifth electron detector includes means for collecting predominantly amplified high angle reflected signals.

38. An improved environmental scanning electron microscope comprising:
(a) a vacuum column having a pressure limiting aperture at the lower end thereof;
(b) a charged particle beam source located within the vacuum column which emits a charged particle beam through said pressure limiting aperture;
(c) focusing means located within said vacuum column which directs a charged particle beam emitted by said charged particle beam source through said pressure limiting aperture;
(d) a specimen chamber, positioned below said pressure limiting pressure which maintains the specimen, enveloped in gas, at a pressure of approximately 1 to 25 Torr in registration with said pressure limiting aperture such that a surface of the sample way be exposed to a charged particle beam emitted from said charged particle beam source and directed through said pressure limiting aperture;
(e) a specimen mount located within said specimen chamber and positioned for supporting said specimen approximately 1 to 20 mm below said pressure limiting aperture so as to allow the focused beam of electrons to interact with said specimen;
(f) an electron detector means including a generally annular electrode assembly having an inner electron detector formed of a thin ring and an outer electron detector which is formed of a plurality of concentric arc segments and a pressure limiting aperture detector formed integrally with said pressure limiting aperture;
(g) a control grid being biased at an electrical potential which is between the bias applied to said specimen mount and said electron detector means so as to accelerate the signals emitted from the specimen towards said control grid for further amplification of secondary electrons.

39. The environmental scanning electron microscope of claim 38 wherein said control grid is positioned closer to said specimen mount than to said electrode detector.

40. The improved environmental scanning electron microscope of claim 38 wherein said electrode detector is biased at approximately 300V+.

41. The improved environmental scanning electron microscope of claim 40 wherein said control grid is biased at 90V+.

42. The improved environmental scanning electron microscope of claim 41 wherein said specimen mount is biased at ground.

43. An improved environmental scanning electron microscope comprising:
(a) a vacuum column having a pressure limiting aperture at the lower end thereof;
(b) a charged particle beam source located within the vacuum column which emits a charged particle beam;
(c) focusing means located within the vacuum column which directs a charged particle beam emitted by said charged particle beam source through said pressure limiting aperture;
(d) a specimen chamber, positioned below said pressure limiting aperture, which maintains the specimen, enveloped in gas, at a pressure of approximately 1 to 25 Torr in registration with the pressure limiting aperture such that a surface of the sample may be exposed to a charged particle beam emitted from the charged particle source and directed through said pressure limiting aperture;
(e) a specimen mount located within said specimen chamber and positioned for supporting said specimen below said pressure limiting aperture so as to allow the focused beam of electrons to interact with said specimen;
(f) a generally annular electrode assembly having an inner electrode detector formed of a thin ring, an intermediate electron detector positioned radially outwardly of said inner electron detector and being formed of a first plurality of concentric arc segments, and an outer electron detector positioned radially outwardly of said intermediate electron detector and being formed of a second plurality of concentric arc segments; and
(e) a control grid positioned between said specimen mount and said generally annular electrode assembly within said specimen chamber, said control grid being biased at an electrical potential greater than the bias applied to the specimen mount and less than the bias applied to said generally annular electrode assembly such that the electrons are accelerated from the specimen to said control grid to produce increased amplification.

44. The improved environmental scanning electron microscope of claim 43 wherein said first plurality of concentric arc segments are positioned generally opposite to said second plurality of concentric arc segments.

45. The improved environmental scanning electron microscope of claim 43 wherein said inner, intermediate and outer electron detectors are aligned along generally the same horizontal plane.

46. The improved environmental scanning electron microscope of claim 43 wherein said generally annular electrode assembly is positioned approximately 10 mm above said specimen mount.

47. The improved environmental scanning electron microscope of claim 46 wherein said control grid is positioned approximately 1 mm from said specimen mount.

48. The improved environmental scanning electron microscope of claim 47 wherein said generally annular electrode assembly is biased at 300V+.

49. The improved environmental scanning electron microscope of claim 48 wherein said specimen mount is biased at ground.

50. The improved environmental scanning electron microscope of claim 49 wherein said control grid is biased at 90V+.

* * * * *